(12) United States Patent
Ma

(10) Patent No.: US 9,911,503 B2
(45) Date of Patent: Mar. 6, 2018

(54) SHIFT REGISTER UNIT, GATE DRIVE CIRCUIT, AND DISPLAY DEVICE

(71) Applicant: Boe Technology Group Co., Ltd., Beijing (CN)

(72) Inventor: Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 483 days.

(21) Appl. No.: 14/555,965

(22) Filed: Nov. 28, 2014

(65) Prior Publication Data

US 2016/0133211 A1    May 12, 2016

(30) Foreign Application Priority Data

Nov. 7, 2014   (CN) .......................... 2014 1 0622296

(51) Int. Cl.
G09G 3/36    (2006.01)
G11C 19/28   (2006.01)
G09G 3/20    (2006.01)

(52) U.S. Cl.
CPC .............. *G11C 19/28* (2013.01); *G09G 3/20* (2013.01); *G09G 3/3677* (2013.01); *G09G 2310/0267* (2013.01); *G09G 2310/08* (2013.01)

(58) Field of Classification Search
CPC ....... G09G 2310/0267; G09G 2310/08; G09G 3/3648; G09G 3/3677
(Continued)

(56) References Cited

U.S. PATENT DOCUMENTS

2003/0146911 A1   8/2003  Nakanishi
2012/0121061 A1   5/2012  Sakamoto et al.
(Continued)

FOREIGN PATENT DOCUMENTS

CN    103000155         3/2013
CN    103151010    *    6/2013
(Continued)

OTHER PUBLICATIONS

Office action from Chinese Application No. 201410622296.0 dated Feb. 3, 2016.

*Primary Examiner* — William Boddie
*Assistant Examiner* — Alecia D English
(74) *Attorney, Agent, or Firm* — Calfee, Halter & Griswold LLP

(57) ABSTRACT

The present application provides a shift register unit as well as a gate drive circuit and a display device using it. The shift register unit comprises an input module, an NAND gate module, an inverter module, a pull-up module and a pull-down module. The input module receives an input signal and a first clock signal, and transfers the input signal to a first input end of the NAND gate module and the pull-down module under the control of the first clock signal. A second input end of the NAND gate module receives a second clock signal input, and an output end thereof connects the inverter module. An output end of the inverter module connects the pull-up module. The pull-up module pulls up the output signal to a high level based on the output of the inverter module. The pull-down module pulls down the output signal to a low level under the control of the received input signal and the second clock signal. By arranging the inverter module, it can be ensured that no floating point exists at the gate of the output transistor so that it is not affected by leak (Continued)

point, thereby maintaining stable signal output and improving stable output ability of the shift register.

16 Claims, 6 Drawing Sheets

(58) Field of Classification Search
USPC .......................................................... 345/100
See application file for complete search history.

(56) References Cited

U.S. PATENT DOCUMENTS

| | | | |
|---|---|---|---|
| 2013/0083885 A1* | 4/2013 | Lee | G11C 19/28 377/69 |
| 2015/0155052 A1* | 6/2015 | Ma | G09G 3/36 345/100 |

FOREIGN PATENT DOCUMENTS

| | | |
|---|---|---|
| CN | 203134382 | 8/2013 |
| CN | 204102543 | 1/2015 |

* cited by examiner

SHIFT REGISTER UNIT, GATE DRIVE CIRCUIT, AND DISPLAY DEVICE

RELATED APPLICATION

The present application claims the benefit of Chinese patent application No. 201410622296.0 filed on Nov. 7, 2014, all the disclosed contents of this Chinese patent application are incorporated herein by reference.

TECHNICAL FIELD

The disclosure relates to the technical field of display, particularly to a shift register unit as well as a gate drive circuit and a display device using the shift register unit.

BACKGROUND ART

As a technology related to the drive circuit of the existing liquid crystal display device, the present field has developed a GOA (Gate-driver on Array) technology, that is, the gate drive circuit is directly integrated on the display array substrate of the liquid crystal display device through photolithographic process. The GOA circuit generally comprises a plurality of cascaded shift register units, each shift register unit connects with a shift register unit in the adjacent row respectively, each shift register unit corresponds to a row of gate line, each shift register unit may provide the output signal to a next shift register unit while outputting the gate drive signal, so as to ensure that the next shift register unit can output the gate drive signal within the next clock period.

However, in the shift register unit adopted in most GOA structures at present, the control node of the output transistor may be always in a floating state under a certain clock signal, the potential at this node may be influenced by electric leakage of surrounding transistors, which may result in change of the gate control potential of the output transistor, thereby influencing stable output of the shift register.

FIG. 1 shows a schematic view of the circuit structure of an 8T1C shift register unit in the prior art. FIG. 2 shows signal timing waveforms of the 8T1C shift register unit as shown in FIG. 1. As shown, the shift register unit comprises two clock inputs CLK1 and CLK2, the two clock signals inputted by which have the same period, but being opposite in phase. In addition, the shift register unit further comprises an input end STV and an output end OUT, and the output end outputs shifted input signals. In actual use, the gate drive circuit of the liquid crystal display device comprises a plurality of cascaded shift registers, the input end of the first shift register receiving frame scan start pulse signal STV, the input end of each subsequent shift register receiving the output signal of the previous shift register. In this way, each shift register outputs a respective STV signal experiencing different times of shifting, i.e., Out_put1, Out_put2 . . . . Wherein the STV signal indicates start of a frame, after it is inputted into a plurality of cascaded shift registers, each of the plurality of shift registers outputs a respective STV signal experiencing different times of shifting, which can act as the gate row drive signal for the corresponding row in the display array substrate of the liquid crystal display device, for driving display of the corresponding row of pixels in the display array substrate of the liquid crystal display device.

The defect as stated above exists exactly in the shift register unit as shown in FIG. 1, that is, under a certain clock signal, the control node of the output transistor may be always in a floating state, the potential at this node may be influenced by electric leakage of surrounding transistors, which may result in change of the gate control potential of the output transistor, thereby influencing stable output of the shift register.

Specifically, in the circuit structure of the shift register unit as shown in FIG. 1, the transistor M19 is an output transistor, whose control node is the node A at its gate. The node A will be always in a floating state under the second, third, fourth clock signals of CLK2, thereby an unstable signal occurs, as shown in the waveform in line 4 of FIG. 2. The reason for this is that prior to the second, third, fourth clock signals of the second clock signal CLK2, the node C keeps a relatively high signal, while the node A keeps a relatively low signal. When a low level signal occurs in the second, third, fourth clock signals of CLK2, this low level signal opens the transistor M20, thereby enabling the node A and the node C to be connected by a conductive path. Moreover, at this point, neither of these two nodes are supplied with voltage by an external direct signal source, hence, unstable signals may occur at both node A and node C, the node A that should keep a low potential will be pulled higher, thus resulting in worse output of the output transistor M19 and influencing the output signal Out of the shift register.

Therefore, there is a need in the art to provide an improved shift register unit, so as to overcome the above defects in the shift register unit of the prior art.

SUMMARY

An object of the present invention is to provide a new-type shift register unit which can overcome the above defects and/or other defects in the shift register unit of the prior art.

According to an aspect of the present invention, a shift register unit is provided, which shift register unit comprises an input module, an NAND gate module, an inverter module, a pull-up module and a pull-down module. The input module connects an input end of the shift register unit and a first clock signal input end for receiving an input signal and a first clock signal. The input module is further connected to a first input end of the NAND gate module and the pull-down module for transferring the input signal to the first input end of the NAND gate module and the pull-down module under the control of the first clock signal. A second input end of the NAND gate module connects a second clock signal input end for receiving a second clock signal input, and an output end of the NAND gate module connects the inverter module. An output end of the inverter module connects the pull-up module. The pull-up module further connects an output end of the shift register unit for pulling up the signal outputted by the output end of the shift register unit to a high level based on the output of the inverter module. The pull-down module further connects the second clock signal input end and the output end of the shift register unit for pulling down the signal outputted by the output end of the shift register unit to a low level under the control of the received input signal and the second clock signal.

In an embodiment, the input module comprises: a first transistor, a first electrode thereof being connected to the input end of the shift register unit so as to receive the input signal, a gate thereof being connected to the first clock signal input end, a second electrode thereof being connected to the pull-down module and the first input end of the NAND gate module.

In an embodiment, the NAND gate module further connects a high level signal input end and a low level signal input end.

In an embodiment, the NAND gate module comprises a second transistor, a third transistor, a fourth transistor. A first electrode of the second transistor connects the high level signal input end, and a second electrode and a gate of the second transistor connect with each other and are connected to a first electrode of the third transistor and the output end of the NAND gate module. A gate of the third transistor is connected to the second clock signal input end, and a second electrode of the third transistor connects a first electrode of the fourth transistor. A gate of the fourth transistor connects the input module, and a second electrode of the fourth transistor connects the low level signal input end.

In an embodiment, the inverter module further connects the high level signal input end and the low level signal input end.

In an embodiment, the inverter module comprises a fifth transistor and a sixth transistor. A first electrode of the fifth transistor connects the high level signal input end, a gate of the fifth transistor connects the output end of the NAND gate module, and a second electrode of the fifth transistor connects a first electrode of the sixth transistor and the pull-up module. The gate and the second electrode of the sixth transistor are connected together, and connect the low level signal input end.

In an embodiment, the pull-up module further connects the high level signal input end.

In an embodiment, the pull-up module comprises: a seventh transistor, a first electrode thereof connecting the high level signal input end, a gate thereof connecting the output end of the inverter module, a second electrode thereof connecting the pull-down module and the output end of the shift register unit.

In an embodiment, the pull-down module comprises: an eighth transistor, a first electrode thereof connecting the output end of the shift register unit, a gate thereof connecting the input module, a second electrode thereof connecting the second clock signal input end; a capacitor connected between the first electrode and the gate of the eighth transistor.

In an embodiment, the transistors in the shift register unit are all P-type transistors.

In an embodiment, the input signal is a pulse start signal.

In an embodiment, the first clock signal and the second clock signal are inverted signals to each other.

According to another aspect of the present invention, a gate drive circuit is provided, which gate drive circuit comprises a plurality of shift register units as stated above. The plurality of shift register units are cascaded to one another, except for the last stage of shift register unit, the output end of each of the other shift register units connects the input end of the adjacent next stage of shift register unit, wherein the output end of each shift register unit is used to output a writing control signal for controlling writing of a line of pixels.

In an embodiment, the signal input end of the first stage of shift register unit receives a frame start signal.

According to a further aspect of the present invention, a display device is provided, which comprises any gate drive circuit as stated above.

Some embodiments of the present invention propose a new-type shift register unit, at the output end of the shift register unit, in order to control the transistor gate at the stable output end, an inverter structure is arranged to ensure that no floating point exists at the gate of the output transistor, so that it will not be influenced by any leak point, thereby maintaining stable signal output and improving stable output ability of the shift register.

In addition, some embodiments of the present invention adopt simple two-clock signal for driving, reduce the number of the transistors and the capacitors, and arrange an inverter structure at the gate of the output transistor, which can keep the potential at this node stable, ensure stable output of the output transistor, and improve anti-leakage ability of the transistor.

BRIEF DESCRIPTION OF DRAWINGS

In order to explain the technical solutions of some embodiments described herein more clearly, these embodiments will be described with reference to the drawings hereinafter. It is apparent that, the drawings described below relate to some embodiments of the present invention, the ordinary skilled person in the art can also obtain other drawings from these drawings without paying any creative work.

DETAILED DESCRIPTION

In order to make the purposes, technical solutions and advantages of some embodiments described herein more clear, the technical solutions of these embodiments will be described in the following clearly and completely in conjunction with the drawings. It needs to be pointed out that the following detailed description of the embodiments is only for illustrating the present invention rather than limiting the scope of the present invention. The embodiments described herein are merely part of rather than all of the embodiments of the present invention. Based on these embodiments described herein, the ordinary skilled person in the art can obtain other different embodiments, all these embodiments fall within the scope of the present invention.

The transistors used in the embodiments described herein can all be thin film transistors or field effect transistors or other devices with the same characteristic. Since the source and the drain of the transistor used here are symmetrical, there is no need to distinguish between the source and the drain thereof. In the present application, in order to distinguish the two electrodes except for the gate of the transistor, sometimes, one electrode thereof is called a first electrode and the other electrode is called a second electrode. In addition, the transistor can be classified into N-type and P-type transistors according to the characteristics of the transistor, all the following embodiments take the P-type transistor as an example for explanation. When the P-type transistor is used, the first electrode may be the source of this P-type transistor, and the second electrode may be the drain of this P-type transistor. Based on the description and teaching of implementations of the P-type transistor herein, the ordinary skilled person in the art can easily think of implementations of the embodiments of the present invention using the N-type transistor without paying any creative work, therefore, these implementations are also within the scope of the present invention.

Figure 1:
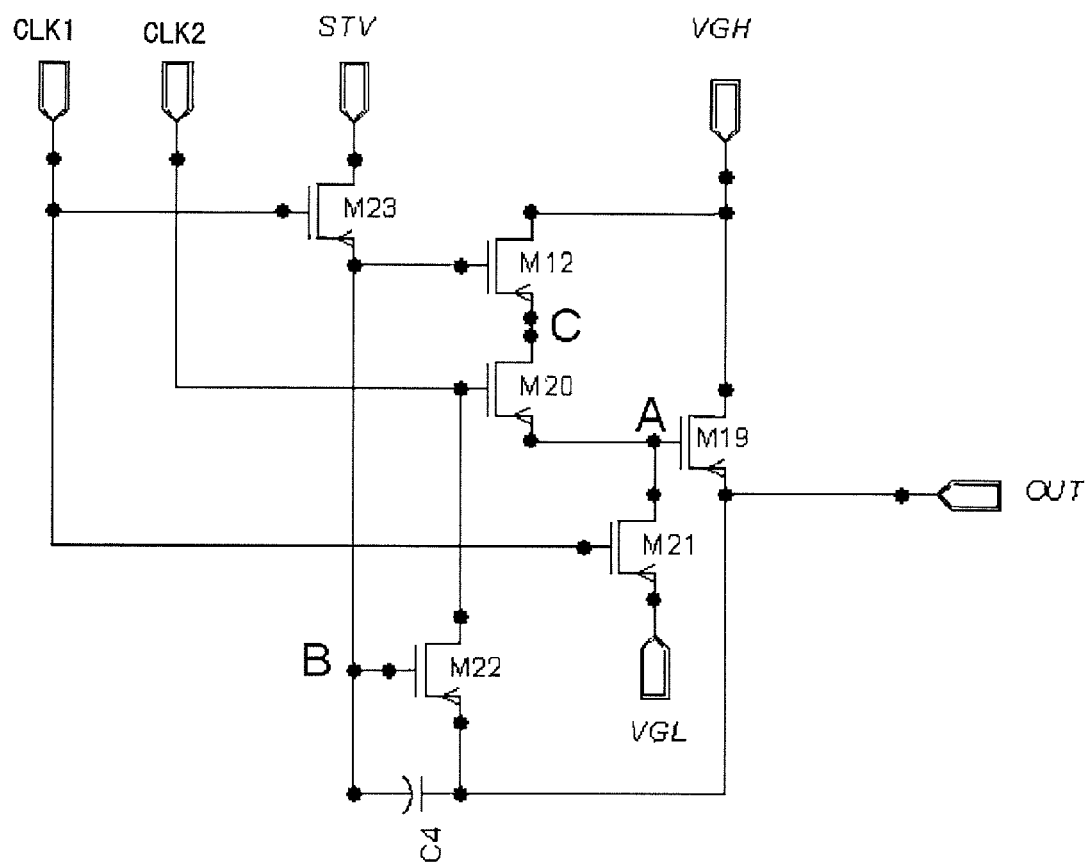
FIG. 1 is a schematic view illustrating the circuit structure of an 8T1C shift register unit in the prior art.
Figure 2:
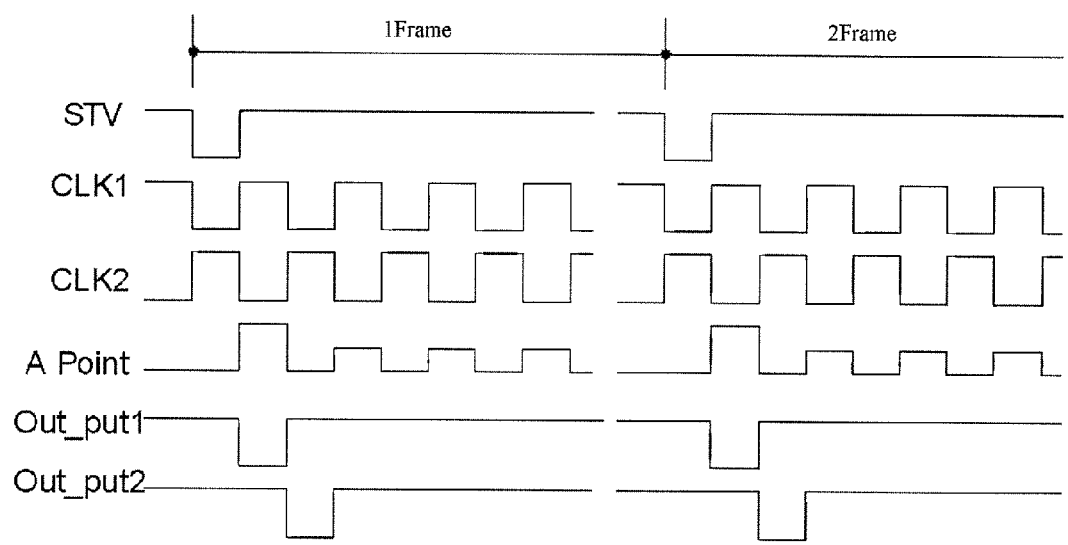
FIG. 2 illustrates signal timing waveforms of the 8T1C shift register unit as shown in FIG. 1.
Figure 3:
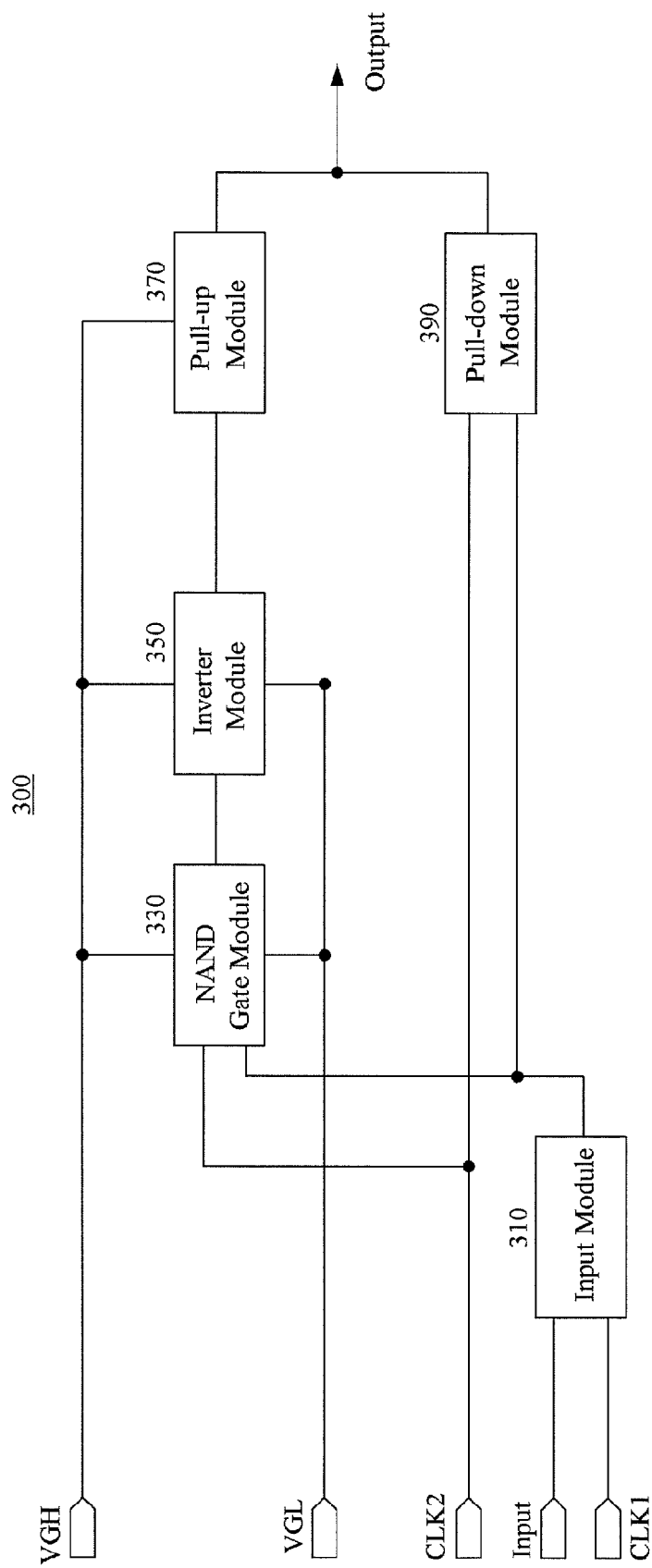
FIG. 3 is a schematic view illustrating the structure of a shift register unit according to an embodiment of the present invention.

FIG. 3 shows a schematic view illustrating the structure of a shift register unit according to an embodiment of the present invention. As shown in the figure, a shift register unit 300 may comprise an input module 310, an NAND gate module 330, an inverter module 350, a pull-up module 370 and a pull-down module 390.

The input module 310 may connect an input end Input of the shift register unit 300 and a first clock signal input end CLK1 for receiving an input signal and a first clock signal. The input module 310 may be further connected to a first input end of the NAND gate module 330 and the pull-down module 390 for transferring the input signal to the first input end of the NAND gate module 330 and the pull-down module 390 under the control of the first clock signal. In an embodiment, the input signal is a start signal.

A second input end of the NAND gate module 330 connects a second clock signal input end CLK2 for receiving a second clock signal input, and the output end of the NAND gate module 330 connects the inverter module 350. In an embodiment, the NAND gate module 330 further connects a high level signal input end and a low level signal input end, which are high level voltage end VGH and low level voltage end VGL in the instance of FIG. 3.

The output end of the inverter module 350 connects the pull-up module 370. In an embodiment, the inverter module 350 further connects the high level signal input end and the low level signal input end, which are high level voltage end VGH and low level voltage end VGL in the instance of FIG. 3.

The pull-up module 370 further connects the output end of the shift register unit 300 for pulling up the signal outputted by the output end of the shift register unit 300 to a high level based on the output of the inverter module 350. In an embodiment, the pull-up module 370 further connects the high level signal input end, which is high level voltage end VGH in the instance of FIG. 3. In an embodiment, the pull-up module 370 outputs the high level voltage signal VGH to the output end of the shift register unit 300 based on the output of the inverter module 350.

The pull-down module 390 further connects the second clock signal input end CLK2 and the output end of the shift register unit 300 for pulling down the signal outputted by the output end of the shift register unit to a low level under the control of the input signal received from the input module 310 and the second clock signal received from the second clock signal input end CLK2. In an embodiment, the pull-down module 390 receives the input signal and the second clock signal, and under the control of one of these two signals, outputs the low level signal of the other signal to the output end of the shift register unit 300.

In an embodiment, the clock signals inputted by the first clock signal input end CLK1 and the second clock signal input end CLK2 are both square wave clock signals and have the same period and duty cycle, however, the two clock signals are opposite in phase. That is to say, if CLK1 inputs a high level, then CLK2 inputs a low level, while if CLK1 inputs a low level, then CLK2 inputs a high level.

In an embodiment, the input end of the shift register unit 300 receives a start signal in the form of a pulse signal, and the output end of the shift register unit 300 outputs the shifted pulse signal.

Figure 4:
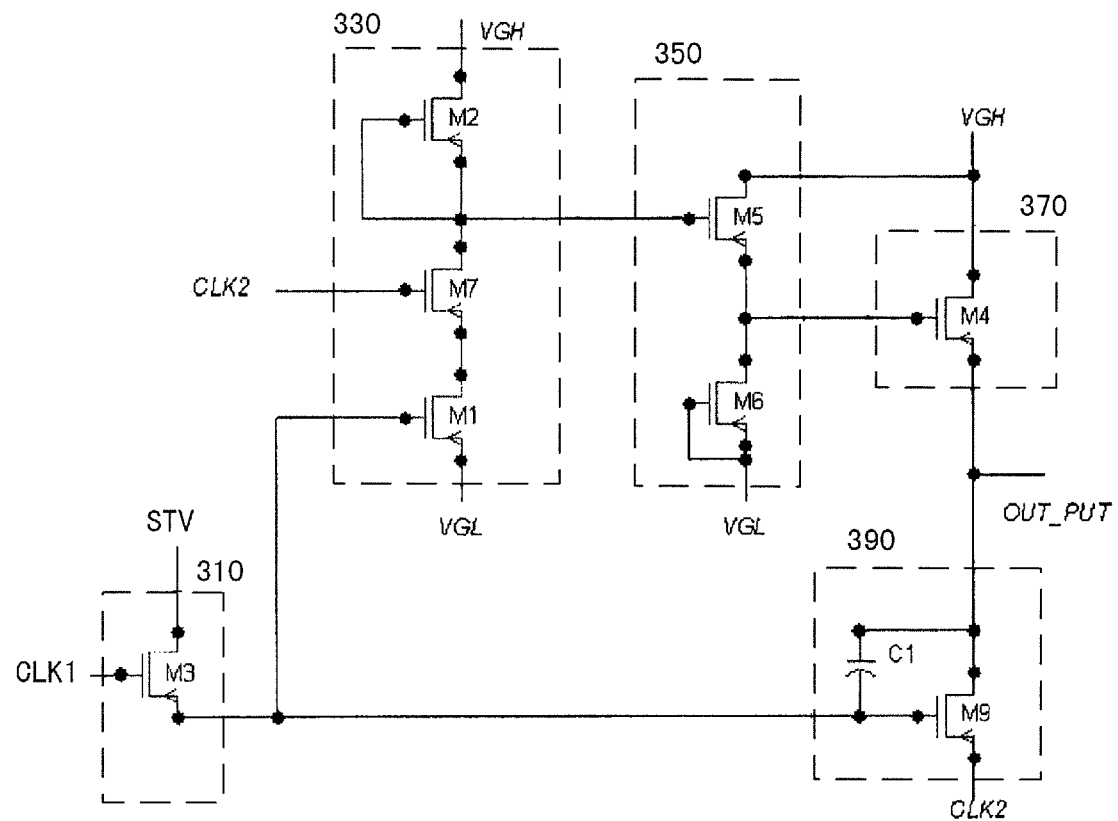
FIG. 4 is a schematic view illustrating the circuit structure of an 8T1C shift register unit according to an embodiment of the present invention.

FIG. 4 shows a schematic view illustrating the circuit structure of an 8T1C shift register unit according to an embodiment of the present invention. In fact, FIG. 4 shows a more specific circuit structure of a specific implementation of the shift register unit 300 as shown in FIG. 3.

As shown in FIG. 4, the input module 310 may comprise a first transistor M3. The first electrode of the first transistor M3 is connected to the input end of the shift register unit 300 so as to receive an input signal (e.g. a start signal or a start signal in the form of a pulse), the gate thereof is connected to the first clock signal input end CLK1, and the second electrode thereof is connected to the pull-down module 390 and the first input end of the NAND gate module 330.

As shown in the figure, the NAND gate module 330 may comprise a second transistor M2, a third transistor M7, a fourth transistor M1. The first electrode of the second transistor M2 connects the high level voltage end VGH, the second electrode and the gate of the second transistor M2 connect with each other and are connected to the first electrode of the third transistor M7 and the inverter module 350. The gate of the third transistor M7 is connected to the second clock signal input end CLK2, and the second electrode of the third transistor M7 connects the first electrode of the fourth transistor M1. The gate of the fourth transistor M1 connects the input module 310, that is, connects the second electrode of the first transistor M3 in the input module 310. The second electrode of the fourth transistor M1 connects the low level voltage end VGL.

As shown in the figure, the inverter module 350 comprises a fifth transistor M5 and a sixth transistor M6. The first electrode of the fifth transistor M5 connects the high level voltage end, the gate of the fifth transistor M5 connects the output end of the NAND gate module 330, and the second electrode of the fifth transistor M5 connects the first electrode of the sixth transistor M6 and the pull-up module 370. The gate and the second electrode of the sixth transistor M6 are connected together and connect the low level voltage end VGL.

As shown in the figure, the pull-up module 370 comprises a seventh transistor M4. The first electrode of the seventh transistor M4 connects the high level voltage end VGH, the gate thereof connects the output end of the inverter module 350, and the second electrode thereof connects the pull-down module 390 and the output end of the shift register unit 300.

As shown in the figure, the pull-down module 390 comprises an eighth transistor M9 and a capacitor C1. The first electrode of the eighth transistor M9 connects the output end of shift register unit 300, the gate thereof connects the input module 310, and the second electrode thereof connects the second clock signal input end CLK2. The capacitor C1 is connected between the first electrode and the gate of the eighth transistor M9.

In the circuit structures as shown in FIG. 4, the P-type transistor is taken as an example for explanation. In the above description, the first electrode and the second electrode are used respectively to indicate the source and the drain of the P-type transistor. It needs to be further pointed out that although the P-type transistor is taken as an example for explanation in the circuit structures as shown in FIG. 4, the ordinary skilled person in the art, based on the description and teaching of implementations of the P-type transistor herein, can also easily think of using implementations of the N-type transistor without paying any creative work, all these implementations are covered within the scope of the present invention.

Figure 5:
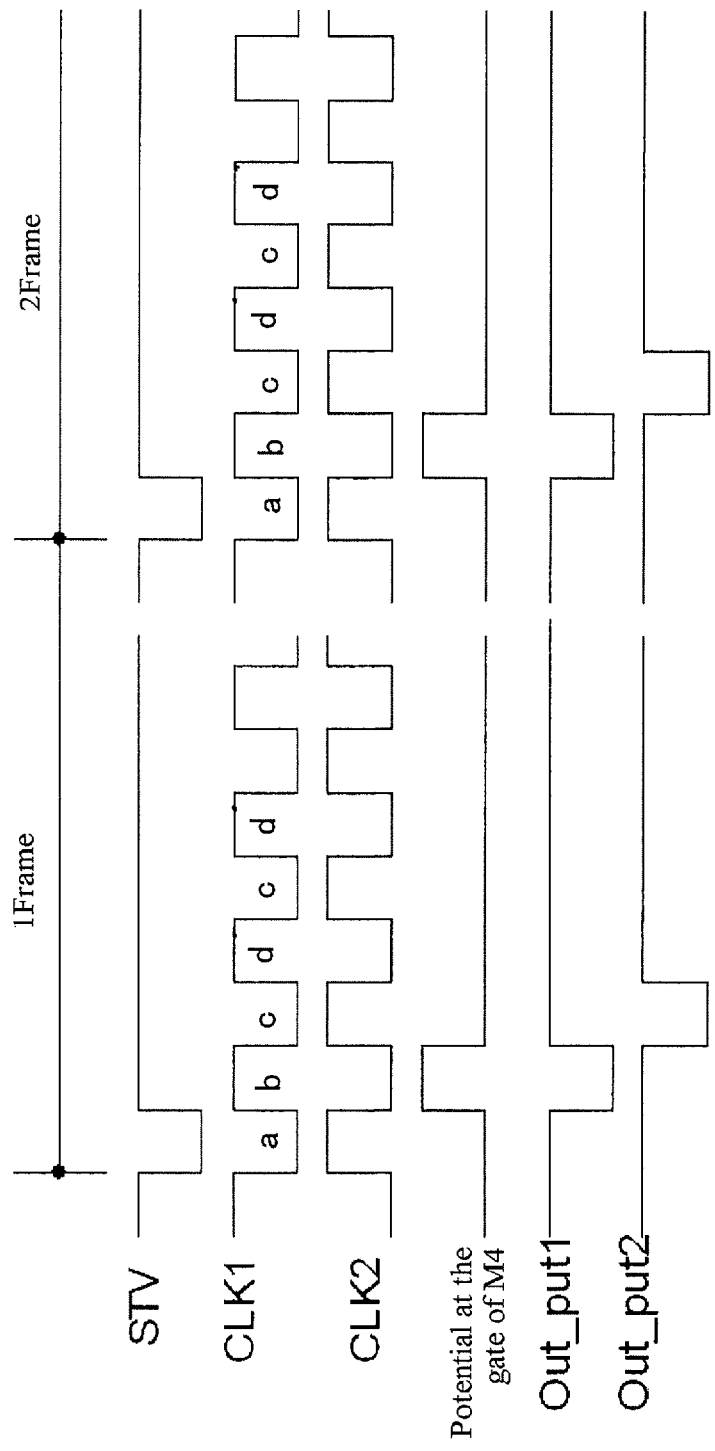
FIG. 5 illustrates signal timing waveforms of the 8T1C shift register unit as shown in FIG. 4.

FIG. 5 shows signal timing waveforms of the 8T1C shift register unit as shown in FIG. 4. Next, the working principle of the 8T1C shift register unit according to an embodiment of the present invention will be explained in conjunction with these waveforms.

The ordinary skilled person in the art knows that the above shift register unit can be applied in the gate driver of the liquid crystal display device. A working period of this gate driver is namely a frame period, and the driving manner of each working period is the same. FIG. 4 shows waveforms of two frame periods, it can be seen that the waveforms of these two frame periods are completely the same.

Each of the frame periods can be explained through the following four timing segments:

Phase a:

As shown in the figure, phase a is namely the first half of the first period of the first clock signal CKL1 in a frame period. As shown in the figure, in phase a, the STV and the CLK1 signals are both at low level. Since the shift register units as shown in FIG. 4 all adopt P-type transistors, the low level signal is an ON signal, which enables the transistor M3 to turn on. In this way, the STV signal will be outputted to the gate of the transistor M9 through the transistor M3, so as to enable the transistor M9 to turn on, thereby the transistor M9 outputs the high level (OFF) signal of the CLK2 to the output end Out_Put of the shift register unit. Meanwhile, the STV signal is also outputted to the gate of the transistor M1 through the transistor M3, thus enabling the transistor M1 to turn on. However, since at this point the CLK2 is a high level OFF signal, the transistor M7 is in an OFF state, so the VGL signal transferred through the transistor M1 cannot be outputted through the transistor M7. In the NAND gate structure constituted by the transistors M1, M2, M7, since the CLK2 is a high level OFF signal, the NAND gate structure outputs the VGH signal to the gate of the transistor M5, such that the transistor M5 is in an OFF state. Thus in the inverter structure constituted by the transistors M5, M6, the low level signal will be outputted through the transistor M6, such that the gate of the transistor M4 is a low level signal, the transistor M4 is turned on, thereby transferring the high voltage level VGH to the output end Out_Put. So, the final output of the shift register unit in this phase is VGH high voltage signal.

Phase b:

As shown in the figure, phase b is namely the second half of the first period of the first clock signal CLK1 in a frame period. As shown in the figure, in phase b, STV and CLK1 are both high level OFF signals, and CLK2 is a low level ON signal. Since CLK1 is a high level OFF signal, it enables the transistor M3 to turn off. Therefore, the low level STV signal inputted through the transistor M3 in phase a is kept at the gate of the transistor M9 by means of the capacitor C1, such that the transistor M9 is still in the ON state, and outputs the low level signal of the CLK2 to the output end Out_Put. Meanwhile, the low level STV signal inputted through the transistor M3 in phase a is also kept at the gate of the transistor M1 by means of the capacitor C1, and the transistor M1 is also in the ON state. The transistor M7 also becomes ON state because the CLK2 at its gate is a low level signal, thus the NAND gate structure will output the VGL low level ON signal through the transistors M1 and M7, so as to enable the transistor M5 in the inverter structure to turn on and to output the VGH to the gate of the transistor M4, thereby enabling the transistor M4 to turn off and ensuring output of the transistor M9. So, the final output of the shift register unit in this phase is a low level signal.

Phase c:

As shown in the figure, phase c is namely the first half of the second period of the first clock signal CLK1 in a frame period. As shown in the figure, in phase c, CLK1 is a low level ON signal, CLK2 is a high level OFF signal, and STV is a high level OFF signal. CLK1 turns on the transistor M3, so as to transmit the STV high level signal to the gate of the transistor M9, and enable the transistor M9 to turn off. Meanwhile, the STV high level signal is also transmitted to the gate of the transistor M1. In this way, in the NAND gate structure, the signals that control the transistors M1 and M7 are both OFF signals, hence, the NAND gate structure outputs the VGH signal to the gate of the transistor M5 of the inverter structure through the transistor M2, such that the inverter structure outputs the low level signal VGL through the transistor M6, so as to enable the transistor M4 to turn on, and transmit the VGH signal to the output end Out_Put. So, the final output of the shift register unit in this phase is a high level signal.

Phase d:

As shown in the figure, phase d is namely the second half of the second period of the first clock signal CLK1 in a frame period. As shown in the figure, in phase d, CLK1 is a high level OFF signal, CLK2 is a low level ON signal, and STV is a high level OFF signal. At this point in the NAND gate structure, the signal that controls the transistor M1 is a high level OFF signal, hence, the NAND gate structure outputs the high level OFF signal to the gate of the transistor M5 of the inverter structure through the transistor M2, such that the inverter structure outputs the low level signal VGL to the gate of the transistor M4 through the transistor M6, so as to turn on the transistor M4, thereby transmitting the VGH signal to the output end Out-Put through the transistor M4. Meanwhile, the transistor M9 is still in the OFF state. So, the final output of the shift register unit in this phase is a high level signal.

The processes after the phases a, b, c and d in the frame period all repeat phase c and phase d.

From the above description and the waveform in line 4 of FIG. 4 it can be seen that:

In phase a, the VGL signal is outputted through the transistor M6 to the gate of the transistor M4 that controls the output signal, and stably controls the ON state of the output transistor M4, so that the transistor M4 can output the VGH signal to the output end Out_Put of the shift register unit stably. Finally, the stable output of the shift register unit can be ensured.

In phase b, the VGH signal is outputted through the transistor M5 to the gate of the transistor M4 that controls the output signal, and stably controls the OFF state of the output transistor M4, so that the transistor M4 blocks interferences of its source and gate signals to the output end Out_Put, so as to output the low level signal of the CLK2 to the output end Out_Put of the shift register unit through the transistor M9 stably. Finally, the stable output of the shift register unit can be ensured.

In each phase c and phase d, the gate of the transistor M4 that controls the output signal has stable low level signal input all the time, and stably controls the ON state of the output transistor M4, so that the transistor M4 can output the VGH signal to the output end Out_Put of the shift register unit stably. Finally, the stable output of the shift register unit can be ensured.

To sum up, in the above shift register unit, no floating point exists at the gate of the output transistor, hence, it will not be influenced by the leak point, the potential at this node can be kept stable, so as to be able to maintain stable signal output of the transistor, and improve anti-leakage ability and stable output ability of the shift register unit.

Figure 6:
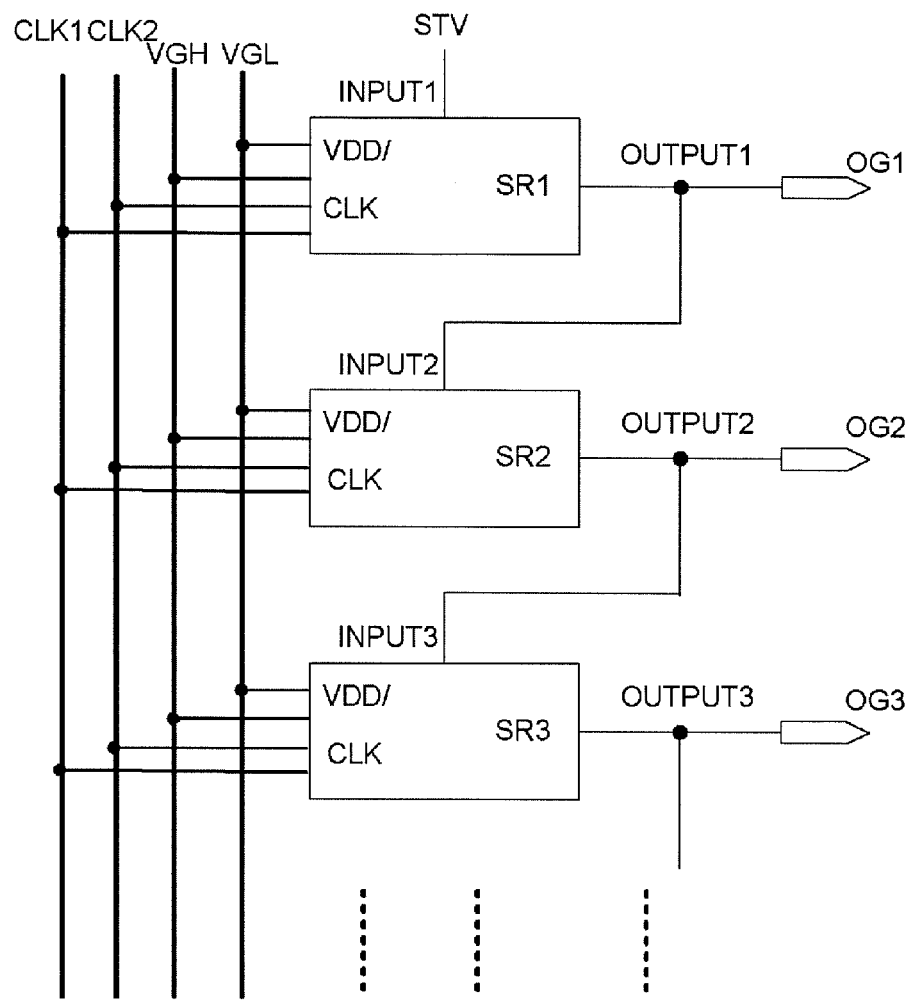
FIG. 6 is a schematic view illustrating the structure of a gate drive circuit according to an embodiment of the present invention.

FIG. 6 shows a schematic view illustrating the structure of a gate drive circuit according to an embodiment of the present invention. The gate drive circuit is used as the gate drive circuit of a display array substrate of a liquid crystal display device for driving line by line scanning or line by line writing of the display array substrate. As shown in the figure, the gate drive circuit comprises a plurality of shift register units, wherein each shift register unit can be the shift register unit according to any embodiment as stated above. The plurality of shift register units are cascaded to one another, except for the last stage of shift register unit, the output end (OUTPUT1, OUTPUT2, OUTPUT3 . . . ) of each of the other shift register units connects the input end (INPUT2, INPUT3 . . . ) of its adjacent next stage of shift register unit, wherein the output end (OUTPUT1, OUTPUT2, OUTPUT3 . . . ) of each shift register unit is used to output a gate drive signal OG1, OG2, OG3 . . . for driving scanning of the corresponding line of pixels in the display array substrate. The gate drive signal can also be called a writing control signal for controlling writing of the corresponding line of pixels in the display array substrate. The number of the shift register units may be equal to the line number of the pixels in the display array substrate to be driven. That is to say, how many lines of pixels to be driven are comprised in the display array substrate, there will be how many shift register units required by the gate drive circuit. However, the ordinary skilled person in the art knows that the number of the shift register units may also be not equal to the line number of the pixels in the display array substrate to be driven, and one shift register unit may also be used for driving multiple lines of pixels in the display array substrate.

The gate drive circuit may comprise a first clock input end CLK1, a second clock input end CLK2 for inputting the first clock signal and the second clock signal to each register unit. The gate drive circuit may also comprise a high level voltage end VGH and a low level voltage end VGL for providing a high level voltage signal and a low level voltage signal to each register unit.

The input end of the first stage of shift register unit of the gate drive circuit receives a frame start signal. In an embodiment, the frame start signal is a pulse signal for indicating start of a frame, which is also called a frame scan start pulse signal STV. The gate drive circuit, after receiving the frame start signal, and after shift registering of the plurality of cascaded shift register units, generates a plurality of shifted pulse signals for driving scanning of the corresponding line of pixels in the display array substrate respectively. For example, the first shift register unit drives scanning of the first line of pixels or controls writing of the first line of pixels, the second shift register unit drives scanning of the second line of pixels or controls writing of the second line of pixels, the third shift register unit drives scanning of the third line of pixels or controls writing of the third line of pixels, and so on. In this way, the gate drive circuit can realize the gate driving of the display array substrate or realize control of line by line writing of frames of images on the display array substrate.

According to another embodiment, a display device can also be provided, which display device comprises the gate drive circuit stated above for performing gate driving on the display device or performing line writing control on the display device. Since the structure of the gate drive circuit has been described in detail in the preceding embodiments, it will not be repeated here. According to another embodiment, the display device is a liquid crystal display device.

Although some embodiments of the present invention have been described in detail in the above with reference to the drawings, the ordinary skilled person in the art can understand that the above specific description is only for explaining the present invention, the present invention is definitely not limited to the above specific implementations. Based on the specific description and teaching of these embodiments herein, the ordinary skilled person in the art can make various modifications, additions, replacements and variants to these specific implementations without departing from the scope of the present invention. That is to say, all these modifications, additions, replacements and variants should be covered within the scope of the present invention. The scope of the present invention should be based on the scope of the claims.

It should be noted that, the relation terms such as first and second and the like herein are only used to distinguish one entity or operation from another entity or operation, while not necessarily requiring or implying that there is any such an actual relation or order between these entities or operations. Moreover, the terms "comprise", "include" or other variants thereof intend to cover a non-exclusive inclusion, so that a process, a method, an article or a device comprising a series of elements not only comprises those elements but also may comprise other elements not listed explicitly, or may further comprise elements inherent in the process, the method, the article or the device. Without further limitations, "a" or "an" before an element does not exclude presence of an additional same element in the process, the method, the article or the device that comprises the element. Just as used herein, the indefinite article "a" or "an" before any element does not exclude presence of a plurality of such elements.

The invention claimed is:

1. A shift register unit comprising: an input module, an NAND gate module, an inverter module, a pull-up module and a pull-down module,
    wherein the input module connects an input end of the shift register unit and a first clock signal input end for receiving an input signal and a first clock signal, the input module is further connected to a first input end of the NAND gate module and the pull-down module for transferring the input signal to the first input end of the NAND gate module and the pull-down module under the control of the first clock signal,
    wherein a second input end of the NAND gate module connects a second clock signal input end for receiving a second clock signal input, an output end of the NAND gate module connects the inverter module;
    wherein an output end of the inverter module connects the pull-up module;
    wherein the pull-up module further connects an output end of the shift register unit for pulling up the signal outputted by the output end of the shift register unit to a high level based on the output of the inverter module;
    wherein the pull-down module further connects the second clock signal input end and the output end of the shift register unit for pulling down the signal outputted by the output end of the shift register unit to a low level under the control of the received input signal and the second clock signal,
    wherein the NAND gate module further connects a high level signal input end and a low level signal input end,
    wherein the NAND gate module comprises a second transistor, a third transistor, a fourth transistor, wherein a first electrode of the second transistor connects the high level signal input end, a second electrode and a gate of the second transistor connect with each other and are connected to a first electrode of the third transistor and the output end of the NAND gate module;

wherein a gate of the third transistor is connected to the second clock signal input end, a second electrode of the third transistor connects a first electrode of the fourth transistor;

wherein a gate of the fourth transistor connects the input module, a second electrode of the fourth transistor connects the low level signal input end.

2. The shift register unit according to claim 1, wherein the input module comprises:

a first transistor, a first electrode thereof being connected to the input end of the shift register unit so as to receive the input signal, a gate thereof being connected to the first clock signal input end, a second electrode thereof being connected to the pull-down module and the first input end of the NAND gate module.

3. The shift register unit according to claim 2, wherein the transistors in the shift register unit are all P-type transistors.

4. The shift register unit according to claim 1, wherein the inverter module further connects a high level signal input end and a low level signal input end.

5. The shift register unit according to claim 4, wherein the inverter module comprises a fifth transistor and a sixth transistor, wherein a first electrode of the fifth transistor connects the high level signal input end, a gate of the fifth transistor connects the output end of the NAND gate module, a second electrode of the fifth transistor connects a first electrode of the sixth transistor and the pull-up module;

wherein a gate and a second electrode of the sixth transistor are connected together, and connect the low level signal input end.

6. The shift register unit according to claim 4, wherein the transistors in the shift register unit are all P-type transistors.

7. The shift register unit according to claim 1, wherein the pull-up module further connects a high level signal input end.

8. The shift register unit according to claim 7, wherein the pull-up module comprises:

a seventh transistor, a first electrode thereof connecting the high level signal input end, a gate thereof connecting the output end of the inverter module, a second electrode thereof connecting the pull-down module and the output end of the shift register unit.

9. The shift register unit according to claim 1, wherein the pull-down module comprises:

an eighth transistor, a first electrode thereof connecting the output end of the shift register unit, a gate thereof connecting the input module, a second electrode thereof connecting the second clock signal input end;

a capacitor connected between the first electrode and the gate of the eighth transistor.

10. The shift register unit according to claim 1, wherein the transistors in the shift register unit are all P-type transistors.

11. The shift register unit according to claim 1, wherein the input signal is a pulse start signal.

12. The shift register unit according to claim 1, wherein the first clock signal and the second clock signal are inverted signals to each other.

13. A gate drive circuit comprising: a plurality of shift register units, wherein each shift register unit comprises an input module, an NAND gate module, an inverter module, a pull-up module and a pull-down module, wherein the input module connects an input end of the shift register unit and a first clock signal input end for receiving an input signal and a first clock signal, the input module is further connected to a first input end of the NAND gate module and the pull-down module for transferring the input signal to the first input end of the NAND gate module and the pull-down module under the control of the first clock signal, wherein a second input end of the NAND gate module connects a second clock signal input end for receiving a second clock signal input, an output end of the NAND gate module connects the inverter module;

wherein an output end of the inverter module connects the pull-up module;

wherein the pull-up module further connects an output end of the shift register unit for pulling up the signal outputted by the output end of the shift register unit to a high level based on the output of the inverter module;

wherein the pull-down module further connects the second clock signal input end and the output end of the shift register unit for pulling down the signal outputted by the output end of the shift register unit to a low level under the control of the received input signal and the second clock signal, wherein the NAND gate module further connects a high level signal input end and a low level signal input end, wherein the NAND gate module comprises a second transistor, a third transistor, a fourth transistor, wherein a first electrode of the second transistor connects the high level signal input end, a second electrode and a gate of the second transistor connect with each other and are connected to a first electrode of the third transistor and the output end of the NAND gate module;

wherein a gate of the third transistor is connected to the second clock signal input end, a second electrode of the third transistor connects a first electrode of the fourth transistor;

wherein a gate of the fourth transistor connects the input module, a second electrode of the fourth transistor connects the low level signal input end, wherein the plurality of shift register units are cascaded to one another, except for the last stage of shift register unit, the output end of each of the other shift register units connects the input end of the adjacent next stage of shift register unit, wherein the output end of each shift register unit is used to output a writing control signal for controlling writing of a line of pixels.

14. The gate drive circuit according to claim 13, wherein the input end of the first stage of shift register unit receives a frame start signal.

15. A display device comprising: a gate drive circuit, the gate drive circuit comprising a plurality of shift register units, wherein each shift register unit comprises an input module, an NAND gate module, an inverter module, a pull-up module and a pull-down module, wherein the input module connects an input end of the shift register unit and a first clock signal input end for receiving an input signal and a first clock signal, the input module is further connected to a first input end of the NAND gate module and the pull-down module for transferring the input signal to the first input end of the NAND gate module and the pull-down module under the control of the first clock signal, wherein a second input end of the NAND gate module connects a second clock signal input end for receiving a second clock signal input, an output end of the NAND gate module connects the inverter module;

wherein an output end of the inverter module connects the pull-up module;

wherein the pull-up module further connects an output end of the shift register unit for pulling up the signal outputted by the output end of the shift register unit to a high level based on the output of the inverter module;

wherein the pull-down module further connects the second clock signal input end and the output end of the shift register unit for pulling down the signal outputted by the output end of the shift register unit to a low level under the control of the received input signal and the second clock signal, wherein the NAND gate module further connects a high level signal input end and a low level signal input end, wherein the NAND gate module comprises a second transistor, a third transistor, a fourth transistor, wherein a first electrode of the second transistor connects the high level signal input end, a second electrode and a gate of the second transistor connect with each other and are connected to a first electrode of the third transistor and the output end of the NAND gate module;

wherein a gate of the third transistor is connected to the second clock signal input end, a second electrode of the third transistor connects a first electrode of the fourth transistor;

wherein a gate of the fourth transistor connects the input module, a second electrode of the fourth transistor connects the low level signal input end, wherein the plurality of shift register units are cascaded to one another, except for the last stage of shift register unit, the output end of each of the other shift register units connects the input end of the adjacent next stage of shift register unit, wherein the output end of each shift register unit is used to output a writing control signal for controlling writing of a line of pixels.

16. The display device according to claim 15, wherein the input end of the first stage of shift register unit receives a frame start signal.

* * * * *